United States Patent
Lee et al.

(10) Patent No.: US 10,163,512 B2
(45) Date of Patent: Dec. 25, 2018

(54) SEMICONDUCTOR DEVICE CAPABLE OF EFFECTIVELY ELIMINATING HOT HOLES IN A CHANNEL AND OPERATING METHOD THEREOF

(71) Applicant: SK hynix Inc., Icheon-si, Gyeonggi-do (KR)

(72) Inventors: Jung Hwan Lee, Suwon-si (KR); Se Chun Park, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/670,913

(22) Filed: Aug. 7, 2017

(65) Prior Publication Data

US 2018/0182461 A1    Jun. 28, 2018

(30) Foreign Application Priority Data

Dec. 23, 2016  (KR) .......................... 10-2016-0177392

(51) Int. Cl.
| | |
|---|---|
| G11C 16/04 | (2006.01) |
| G11C 16/08 | (2006.01) |
| G11C 8/08 | (2006.01) |
| G11C 16/30 | (2006.01) |
| G11C 8/14 | (2006.01) |

(52) U.S. Cl.
CPC ............... *G11C 16/08* (2013.01); *G11C 8/08* (2013.01); *G11C 8/14* (2013.01); *G11C 16/30* (2013.01); *G11C 16/0483* (2013.01)

(58) Field of Classification Search
CPC ............ G11C 16/08; G11C 8/08; G11C 16/30
USPC ............. 365/185.11, 185.13, 185.23, 185.25
See application file for complete search history.

(56) References Cited

U.S. PATENT DOCUMENTS

| | | | | |
|---|---|---|---|---|
| 9,704,580 B2 * | 7/2017 | Rhie | ..................... | G11C 16/06 |
| 2007/0242525 A1 * | 10/2007 | Shen | ..................... | G11C 16/16 |
| | | | | 365/185.29 |
| 2012/0120725 A1 * | 5/2012 | Ahn | ..................... | G11C 16/0483 |
| | | | | 365/185.02 |
| 2018/0047450 A1 * | 2/2018 | Lee | ..................... | G11C 16/24 |

FOREIGN PATENT DOCUMENTS

| | | |
|---|---|---|
| KR | 1020150135903 A | 12/2015 |
| KR | 1020160047661 A | 5/2016 |

* cited by examiner

*Primary Examiner* — Vu Le
(74) *Attorney, Agent, or Firm* — William Park & Associates Ltd.

(57) ABSTRACT

A semiconductor device and or method of operating the same may be provided. The semiconductor device may include a pass circuit unit configured to connect global signal lines to signal lines to set voltage levels of the signal lines.

19 Claims, 8 Drawing Sheets

SEMICONDUCTOR DEVICE CAPABLE OF EFFECTIVELY ELIMINATING HOT HOLES IN A CHANNEL AND OPERATING METHOD THEREOF

CROSS-REFERENCE TO RELATED APPLICATION

The present application claims priority under 35 U.S.C. § 119(a) to Korean patent application number 10-2016-0177392 filed on Dec. 23, 2016, in the Korean Intellectual Property Office, the entire disclosure of which is incorporated by reference herein.

BACKGROUND

1. Technical Field

An aspect of the present disclosure may generally relate to an electronic device, and more particularly, to a semiconductor device and an operating method thereof.

2. Related Art

Semiconductor devices, particularly, semiconductor memory devices are generally classified into volatile memory devices and nonvolatile memory devices.

A non-volatile memory device performs a read and write operation at a relatively low speed, but retains stored data even when a power supply is cut off. Accordingly, the non-volatile memory device is used to store data to be retained regardless of a power supply. Examples of the non-volatile memory device are a read-only memory (ROM), a mask ROM (MROM), a programmable ROM (PROM), an erasable programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), and the like. Flash memories are classified into NOR type flash memories and NAND type flash memories.

The flash memories have an advantage of a RAM in which data is freely programmed and erased, and an advantage of the ROM in which stored data is retained even when a power supply is cut off. The flash memories are widely used as a storage medium of portable electronic devices such as a digital camera, a personal digital assistant (PDA), and an MP3 player.

SUMMARY

According to an embodiment, a semiconductor memory device may be provided. The semiconductor memory device may include a memory unit including a plurality of memory blocks. The semiconductor memory device may include a block decoder circuit configured to generate a plurality of block selection signals based on a decoder control signal and an address signal. The semiconductor memory device may include a pass circuit unit configured for connecting first and second global word line groups to word lines of the plurality of memory blocks in response to the plurality of block selection signals. The semiconductor memory device may include a voltage supply circuit configured for generating and outputting operating voltages and a set voltage to the first and second global word line groups during operations of the semiconductor memory device. The semiconductor memory device may include a control logic configured to control the voltage supply circuit and the block decoder circuit to apply the operating voltages to word lines of a selected memory block, among the plurality of memory blocks, and the set voltage to word lines of an unselected memory block, among the plurality of memory blocks, during the operations. The pass circuit unit may allow for voltage levels of the word lines of the plurality of memory blocks to float in a floating state during the operations before potential levels of the word lines of the selected memory block are discharged.

According to an embodiment, a semiconductor memory device may be provided. The semiconductor memory device may include a memory unit including a plurality of memory blocks. The semiconductor memory device may include a block decoder circuit configured to generate a plurality of block selection signals based on a decoder control signal and an address signal. The semiconductor memory device may include a pass circuit unit configured to connect global word lines to word lines of a selected memory block, among the plurality of memory blocks, based on the plurality of block selection signals. The semiconductor memory device may include a voltage supply circuit configured for generating and outputting operating voltages to the global word lines during operations. The semiconductor memory device may include a control logic configured to control the block decoder circuit so that the pass circuit unit applies the operating voltages to word lines of an unselected memory block, among the plurality of memory blocks, for a predetermined time before the operations are completed. The voltage supply circuit may apply a set voltage to the global word lines after the operations are completed.

According to an embodiment, a method of operating a semiconductor memory device may be provided. The method of manufacturing a semiconductor memory device may include generating operating voltages for operations and applying the operating voltages to global word lines. The method of manufacturing a semiconductor memory device may include connecting word lines of a selected memory block, among a plurality of memory blocks, to the global word lines, and applying the operating voltages to the word lines of the selected memory block. The method of manufacturing a semiconductor memory device may include floating the word lines of the selected memory block by blocking the word lines of the selected memory block from the global word lines before the operations are completed. The method of manufacturing a semiconductor memory device may include applying a positive set voltage to the global word lines.

According to an embodiment, a pass circuit unit may be provided. The pass circuit unit may include a pass circuit configured to transfer or block operating voltages through a global word line group to or from word lines during an operation based on activation or deactivation of the pass circuit. The pass circuit may be deactivated before potential levels of the word lines are discharged upon completion of the operation to allow voltage levels of word lines having a higher potential level than a ground voltage by way of the operating voltages to be floated.

DETAILED DESCRIPTION

Figure 1:
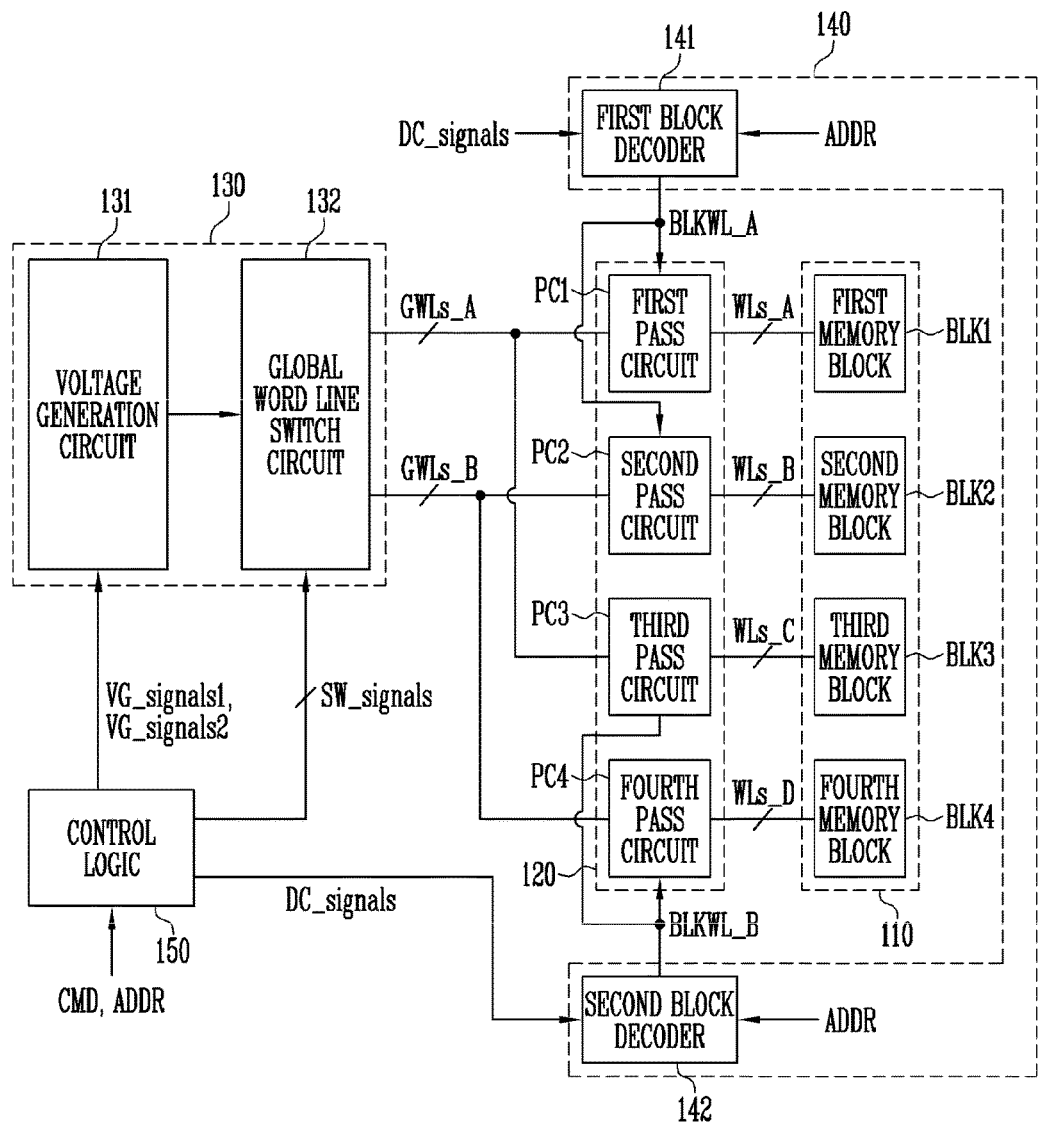
FIG. 1 is a block diagram illustrating a semiconductor memory device according to an embodiment.

In the following detailed description, only certain examples of embodiments of the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is a different disclosure.

Examples of embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the examples of embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

Various embodiments may generally relate to a semiconductor memory device capable of preventing generation or introduction of hot holes in a channel of a memory block during an operation of the semiconductor memory device and a method of operating the same.

FIG. 1 is a block diagram illustrating a semiconductor memory device according to an embodiment.

Referring to FIG. 1, a semiconductor memory device 100 may include a memory unit 110, a pass circuit unit 120, a voltage supply circuit 130, a block decoder circuit 140, and a control logic 150.

The memory unit 110 may include a plurality of memory blocks. According to an embodiment, for convenience of explanation, the memory unit 110 may include first, second, third and fourth memory blocks BLK1, BLK2, BLK3 and BLK4.

Each of the first to fourth memory blocks BLK1 to BLK4 may include a plurality of memory cells. According to an embodiment, these memory cells may be non-volatile memory cells. A group of memory cells coupled to one word line, among the plurality of memory cells, may be defined as one page. In addition, each of the first to fourth memory blocks BLK1 to BLK4 may include a plurality of strings.

According to an embodiment, the first memory block BLK1 and the third memory block BLK3 may be defined to correspond to a first global word line group GWLs_A and the second memory block BLK2 and the fourth memory block BLK4 may be defined to correspond to a second global word line group GWLs_B.

The detailed configuration of the first to fourth memory blocks BLK1 to BLK4 is described below.

The pass circuit unit 120 may include a plurality of pass circuits, for example, pass circuits corresponding to the memory blocks included in the memory unit 110, respectively. According to an embodiment, for convenience of explanation, the memory unit 110 may include the first to fourth memory blocks BLK1 to BLK4, the pass circuit unit 120 may include a first pass circuit PC1 corresponding to the first memory block BLK1, a second pass circuit PC2 corresponding to the second memory block BLK2, a third pass circuit PC3 corresponding to the third memory block BLK3, and a fourth pass circuit PC4 corresponding to the fourth memory block BLK4.

The first pass circuit PC1 may be connected between the first global word line group GWLs_A and word lines WLs_A of the first memory block BLK1. The first pass circuit PC1 may connect or block the first global word line group GWLs_A and the word lines WLs_A to or from each other in response to a first block selection signal BLK-WL_A.

The second pass circuit PC2 may be connected between the second global word line group GWLs_B and word lines WLs_B of the second memory block BLK2. The second pass circuit PC2 may connect or block the second global word line group GWLs_B and the word lines WLs_B to or from each other in response to the first block selection signal BLKWL_A.

The third pass circuit PC3 may be connected between the first global word line group GWLs_A and word lines WLs_C of the third memory block BLK3. The third pass circuit PC3 may connect or block the first global word line group GWLs_A and the word lines WLs_C to or from each other in response to a second block selection signal BLK-WL_B.

The fourth pass circuit PC4 may be connected between the second global word line group GWLs_B and word lines WLs_D of the fourth memory block BLK4. The fourth pass circuit PC4 may connect or block the second global word line group GWLs_B and the word lines WLs_D to or from each other in response to the second block selection signal BLKWL_B.

When a corresponding memory block is a selected memory block during operations of the semiconductor memory device 100, for example, a program operation or a read operation, the first to fourth pass circuits PC1 to PC4 may apply operating voltages transferred through the first global word line group GWLs_A or the second global word line group GWLs_B to word lines and be deactivated before potential levels of the word lines are discharged upon completion of the operations. Thus, word lines having higher potential levels than a ground voltage by the operating voltages may be floated, so that the word lines may maintain the higher potential levels than the ground voltage.

When the corresponding memory block during the operations is an unselected memory block, the first to fourth pass circuits PC1 to PC4 may apply a positive set voltage to word lines of the corresponding memory block through the first global word line group GWLs_A or the second global word line group GWLs_B, and be deactivated before potential levels of word lines of a selected memory block are discharged upon completion of the operations. Thus, the word lines of the unselected memory block may be floated while maintaining higher potential levels than a ground voltage.

The voltage supply circuit 130 may include a voltage generation circuit 131 and a global word line switch circuit 132.

The voltage generation circuit 131 may generate a plurality of operating voltages to perform the operations of the semiconductor memory device 100 in response to first and second voltage generation control signals VG_signals1 and VG_signals2.

For example, the voltage generation circuit 131 may generate a program voltage and a pass voltage to be applied to word lines of a selected memory block in response to the first control signals VG_signals1 and a positive set voltage to be applied to word lines of unselected memory blocks in response to the second control signals VG_signals2 during a program operation of the semiconductor memory device 100.

The global word line switch circuit 132 may transfer the operating voltages to be applied to the selected memory block and the positive set voltage to be applied to the unselected memory block, which are generated by the voltage generation circuit 131, to the first global word line group GWLs_A and the second global word line group GWLs_B in response to switching control signals SW_signals.

In addition, the voltage generation circuit 131 may generate and output a positive voltage right after the operations of the semiconductor memory device 100 are completed. The global word line switch circuit 132 may apply the positive voltage generated by the voltage generation circuit 131 to the first global word line group GWLs_A and the second global word line group GWLs_B. As a result, even when the entirety of the pass circuits of the pass circuit unit 120 are deactivated, potential levels of the first global word line group GWLs_A and the second global word line group GWLs_B may be maintained at the positive voltage, so that potential levels of the word lines of the first to fourth memory blocks BLK1 to BLK4 may be prevented from dropping due to a leakage current.

The block decoder circuit 140 may include a plurality of block decoders. For example, one block decoder may correspond to at least two memory blocks included in the memory unit 110. According to an embodiment, for convenience of explanation, the memory unit 110 may include the first to fourth memory blocks BLK1 to BLK4, and the block decoder circuit 140 may include a first block decoder 141 corresponding to the first and second memory blocks BLK1 and BLK2 and a second block decoder 142 corresponding to the third and fourth memory blocks BLK3 and BLK4.

The block decoder circuit 140 may generate the first block selection signal BLKWL_A and the second block selection signal BLKWL_B in response to an address signal ADDR and a decoder control signal DC_signals.

The first block decoder 141 may generate the first block selection signal BLKWL_A in response to the address signal ADDR and the decoder control signal DC_signals. For example, during operations of the semiconductor memory device 100, when the first memory block BLK1 or the second memory block BLK2 is a selected memory block, the first block decoder 141 may generate and output the first block selection signal BLKWL_A activated at a high potential level to the first pass circuit PC1 and the second pass circuit PC2 in response to the address signal ADDR corresponding to the first memory block BLK1 or the second memory block BLK2.

During the operations, when the first memory block BLK1 and the second memory block BLK2 are unselected memory blocks, the first block decoder 141 may output the first block selection signal BLKWL_A remaining deactivated and having a high voltage level to the first pass circuit PC1 and the second pass circuit PC2 for a predetermined time before the operations are completed in response to the address signal ADDR corresponding to the third memory block BLK3 or the fourth memory block BLK4.

The second block decoder 142 may generate the second block selection signal BLKWL_B in response to the address signal ADDR and the decoder control signal DC_signals. For example, during the operations of the semiconductor memory device 100, when the third memory block BLK3 or the fourth memory block BLK4 is a selected memory block, the second block decoder 142 may generate and output the second block selection signal BLKWL_B activated to have a high potential level to the third pass circuit PC3 and the fourth pass circuit PC4 in response to the address signal ADDR corresponding to the third memory block BLK3 and the fourth memory block BLK4.

During the operations, when the third memory block BLK3 and the fourth memory block BLK4 are unselected memory blocks, the second block decoder 142 may output the second block selection signal BLKWL_B remaining deactivated and having a high voltage level for a predetermined time before the operations are completed to the third pass circuit PC3 and the fourth pass circuit PC4 in response to the address signal ADDR corresponding to the first memory block BLK1 or the second memory block BLK2.

The control logic 150 may control the voltage supply circuit 130 and the block decoder circuit 140 in response to a command signal CMD and the address signal ADDR which are externally input. For example, when the command signal CMD relating to a program operation or a read operation is input, the control logic 150 may generate and output the first and second voltage generation control signals VG_signals1 and VG_signals2 so that the voltage generation circuit 131 of the voltage supply circuit 130 may generate a plurality of operating voltages and a positive set voltage, and generate and output the switching control signals SW_signals so that the operating voltages and the positive set voltage may be controlled to be transferred to the first global word line group GWLs_A and the second global word line group GWLs_B.

The control logic 150 may generate the decoder control signal DC_signals to control the block decoder circuit 140 so that block decoder corresponding to a selected memory block, among the plurality of block decoders included in the block decoder circuit 140, may output a block selection signal activated at a high potential level, and a block decoder corresponding to an unselected memory block may output a block selection signal activated at a high potential level and then deactivated to a low level for a predetermined time right before the operations is completed.

Right after the operations are completed, the control logic 150 may control the voltage supply circuit 130 to apply a positive voltage to the first and second global word line groups GWLs_A and GWLs_B.

Figure 2:
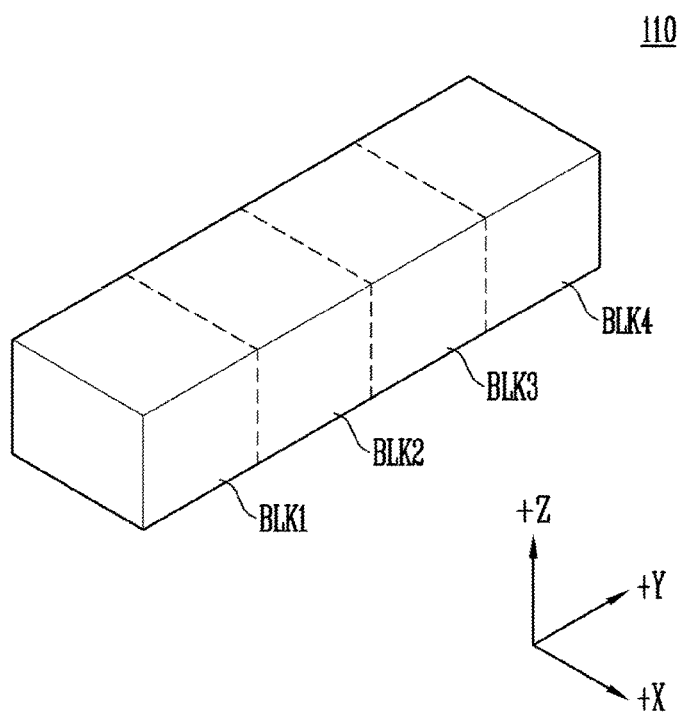
FIG. 2 is a block diagram illustrating an embodiment of a memory unit illustrated in FIG. 1.

FIG. 2 is a block diagram illustrating an embodiment of the memory unit 110 illustrated in FIG. 1.

Referring to FIG. 2, the memory unit 110 may include the first to fourth memory blocks BLK1 to BLK4. Each memory block may have a three-dimensional structure. Each memory block may include a plurality of memory cells stacked over a substrate. These memory cells may be arranged in +X direction, +Y direction and +Z direction. The structure of each memory block is described below with reference to FIG. 3.

Figure 3:
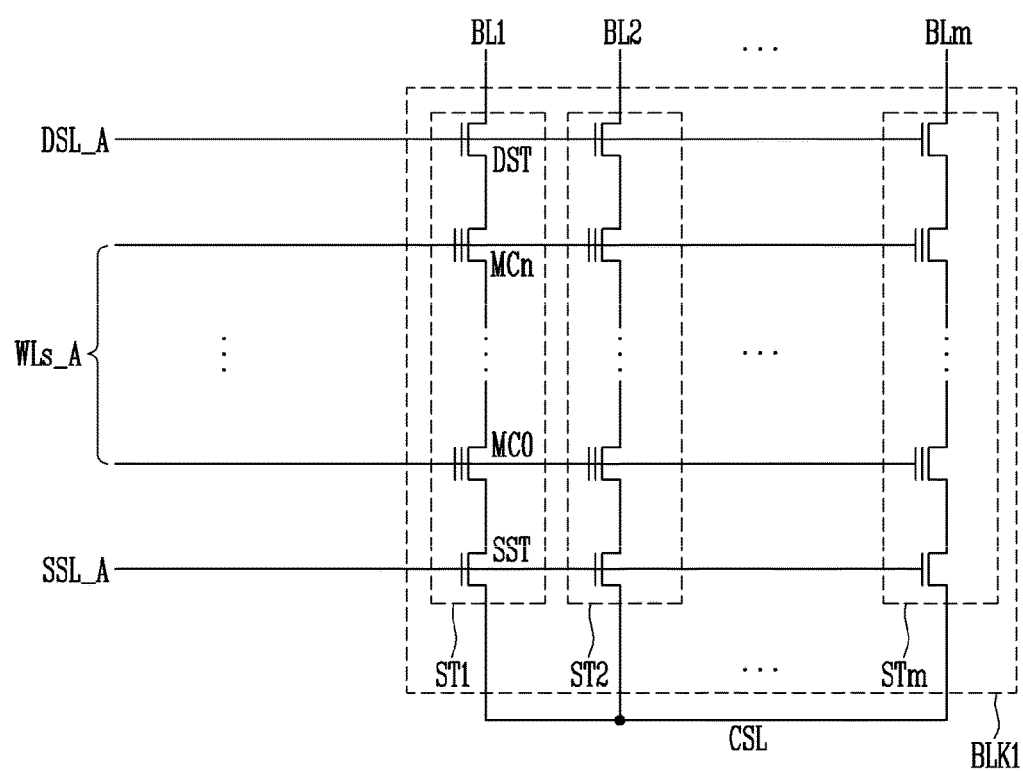
FIG. 3 is a circuit diagram of a memory block illustrated in FIG. 1.

FIG. 3 is a circuit diagram of a first memory block among the memory blocks included in the memory unit 110 illustrated in FIG. 3.

For convenience of explanation, only the first memory block BLK1 is described below since the first memory block BLK1 illustrated in FIG. 1 and the second to fourth memory blocks BLK2 to BLK4 may have similar structures to each other.

The first memory block BLK1 may include a plurality of strings ST1 to STm connected between a common source line CSL and a plurality of bit lines BL1 to BLm.

The plurality of strings ST1 to STm may have similar structures. The first string ST1 may include a source selection transistor SST, a plurality of memory cells MC0 to MCn and a drain selection transistor DST that are coupled in series between the common source line CSL and the bit line BL1. Gates of the plurality of memory cells MC0 to MCn may be coupled to the word lines WLs_A, respectively. A gate of the drain selection transistor DST may be coupled to a drain selection line DSL_A and a gate of the source selection transistor SST may be coupled to a source selection line SSL_A.

According to an embodiment, it is described that each of the plurality of strings may include the source selection transistor SST, the plurality of memory cells MC0 to MCn and the drain selection transistor DST. However, the invention is not limited thereto. A pipe transistor (not illustrated) may be further included between the plurality of cells MC0 to MCn. The pipe transistor may be arranged at a lowermost portion of a string having a U-shaped channel structure. The pipe transistor may electrically couple a channel of source side memory cells coupled between the pipe transistor and the source selection transistor SST and a channel of drain side memory cells coupled between the pipe transistor and the drain selection transistor DST.

Figure 4:
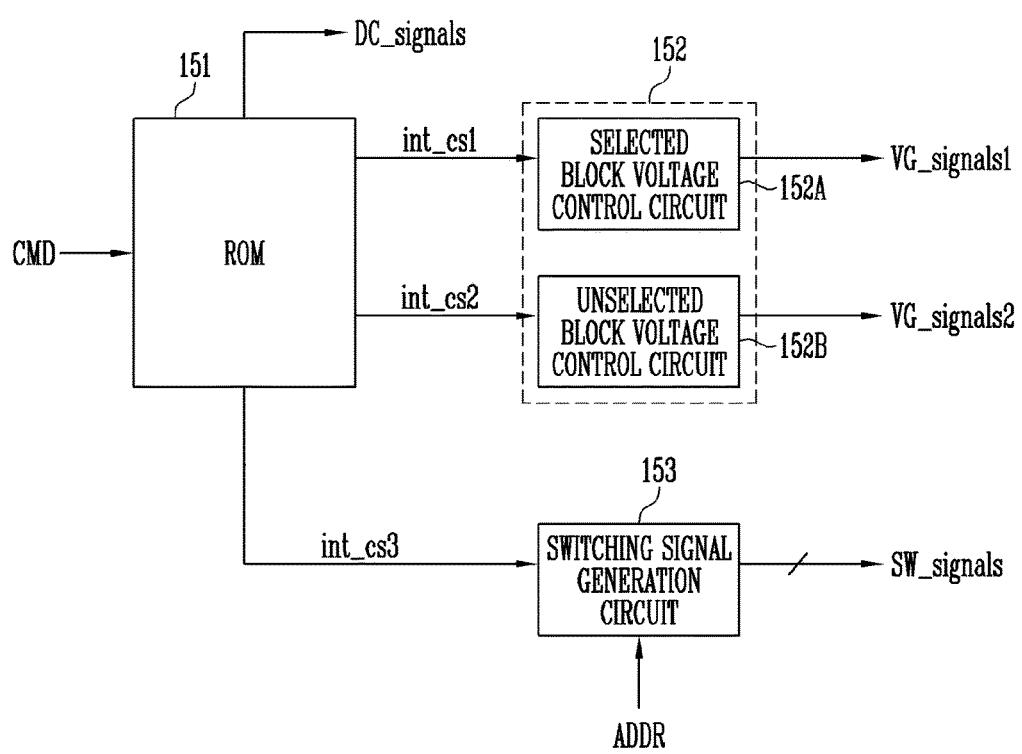
FIG. 4 is a block diagram illustrating an embodiment of a control logic illustrated in FIG. 1.

FIG. 4 is a block diagram illustrating an embodiment of the control logic 150 illustrated in FIG. 1.

Referring to FIG. 4, the control logic 150 may include a ROM 151, a voltage generation control circuit 152, and a switching signal generation circuit 153.

The ROM 151 may store an algorithm for performing operations of the semiconductor memory device. For example, the ROM 151 may generate and output first to third internal control signals int_cs1 to int_cs3 and the decoder control signal DC_signals according to the command signal CMD from an external device, for example, a host connected to the semiconductor memory device, and the algorithm stored therein.

The voltage generation control circuit 152 may include a selected block voltage control circuit 152A and an unselected block voltage control circuit 152B.

The selected block voltage control circuit 152A may generate and output the first voltage generation control signals VG_signals1 to control the voltage generation circuit 131 as illustrated in FIG. 1 to generate operating voltages to be applied to word lines of the selected memory block in response to the first internal control signal int_cs1.

The unselected block voltage control circuit 152B may generate and output the second voltage generation control signals VG_signals2 to control the voltage generation circuit 131 to generate a positive set voltage to be applied to word lines of the unselected memory block in response to the second internal control signal int_cs2.

The switching signal generation circuit 153 may generate and output the switching control signals SW_signals to control the global word line switch circuit 132 illustrated in FIG. 1 to transfer the operating voltages to be applied to the selected memory block and the positive set voltage to be applied to the unselected memory block, which are generated by the voltage generation circuit 131, to the first global word line group GWLs_A and the second global word line group GWLs_B in response to the address signal ADDR and the third internal control signal int_cs3.

Figure 5:
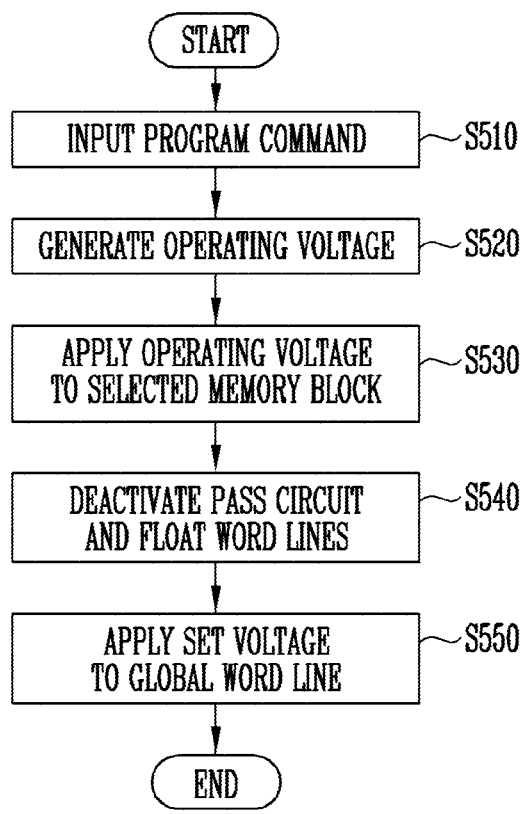
FIG. 5 is a flowchart illustrating a method of operating a semiconductor memory device according to an embodiment.

FIG. 5 is a flowchart illustrating a method of operating a semiconductor memory device according to an embodiment.

A method of operating a semiconductor memory device according to an embodiment is described below with reference to FIGS. 1 to 5.

A program operation, among operations of a semiconductor memory device, is described as an example. However, the disclosure is not limited thereto and is applicable to a read operation or an erase operation.

According to an embodiment, for example, a program operation may be performed on the first memory block BLK1 selected from among the plurality of memory blocks BLK1 to BLK4. In other words, the first memory block BLK1 may be defined as a selected memory block and the second to fourth memory blocks BLK2 to BLK4 may be defined as unselected memory blocks.

The command signal CMD for a program command and the address signal ADDR corresponding to the first memory block BLK1 may be input from the host outside the semiconductor memory device (S510).

The ROM 151 of the control logic 150 may generate and output the first to third internal control signals int_cs1 to int_cs3 and the decoder control signal DC_signals in response to the command signal CMD and an algorithm stored therein.

The voltage generation control circuit 152 of the control logic 150 may generate and output the first voltage generation control signals VG_signals1 and the second voltage generation control signals VG_signals2 in response to the first internal control signal int_cs1 and the second internal control signal int_cs2. The voltage generation circuit 131 may generate and output operating voltages to be applied to the selected first memory block BLK1 and a positive set voltage to be applied to unselected second to fourth memory blocks BLK2 to BLK4 during the program operation in response to the first voltage generation control signals VG_signals1 and the second voltage generation control signals VG_signals2 (S520).

The switching signal generation circuit 153 of the control logic 150 may generate and output the switching control signals SW_signals in response to the third internal control signal int_cs3 and the address signal ADDR. The global word line switch circuit 132 may apply the operating voltages generated by the voltage generation circuit 131 to the first global word line group GWLs_A and the positive set voltage to the second global word lines GWLs_B.

The block decoder circuit 140 may generate and output the first block selection signal BLKWL_A at a high voltage level and the second block selection signal BLKWL_B at a ground voltage level in response to the address signal ADDR and the decoder control signal DC_signals.

The first pass circuit PC1 may connect the first global word line group GWLs_A to the word lines WLs_A of the first memory block BLK1 to apply the operating voltages to the first memory block BLK1 in response to the first block selection signal BLKWL_A (S530).

The second pass circuit PC2 may connect the second global word line group GWLs_B to the word lines WLs_B of the second memory block BLK2 to apply the positive set voltage to the second memory block BLK2 in response to the first block selection signal BLKWL_A. The third pass circuit PC3 and the fourth pass circuit PC4 may be deactivated in response to the second block selection signal BLKWL_B.

Subsequently, the second block decoder 142 may generate and output the second block selection signal BLKWL_B activated at a high potential level for a predetermined time and deactivated to a low level before the program operation of the first memory block BLK1 is completed in response to the decoder control signal DC_signals. Therefore, the third pass circuit PC3 and the fourth pass circuit PC4 may be activated for the predetermined time and apply the operating voltages and the positive set voltage to the word lines WLs_C and WLs_D of the third memory block BLK3 and the fourth memory block BLK4. Potential levels of the word lines WLs_C and WLs_D of the third memory block BLK3 and the fourth memory block BLK4 may increase to be greater than a ground voltage level.

Subsequently, the block decoder circuit 140 may deactivate the first block selection signal BLKWL_A and the second block selection signal BLKWL_B to a ground voltage level and output the deactivated first and second block selection signals right before the program operation of the first memory block BLK1 is completed. As a result, the first to fourth pass circuits PC1 to PC4 may be deactivated, and the word lines WLs_A, WLs_B, WLs_C, and WLs_D of the first to fourth memory blocks BLK1 to BLK4 having higher positive potential levels than the ground voltage level may be floated while having higher positive potential levels than a ground voltage level (S540). Since the word lines WLs_A, WLs_B, WLs_C, and WLs_D of the first to fourth memory blocks BLK1 to BLK4 are maintained at the positive potential levels, hot holes generated or introduced in a channel of the plurality of strings ST1 to STm may be removed through the common source line CSL.

The global word line switch circuit 132 may apply the positive set voltage generated by the voltage generation circuit 131 to the first global word line group GWLs_A and the second global word line group GWLs_B (S550). As a result, the first global word line group GWLs_A and the second global word line group GWLs_B may maintain positive set voltage levels, so that the potential levels of the word lines WLs_A, WLs_B, WLs_C, and WLs_D of the first to fourth memory blocks BLK1 to BLK4 may be prevented from being reduced by a leakage current.

As described above, according to an embodiment, before operations of the semiconductor memory device are completed, word lines of a selected memory block and unselected memory blocks may be floated while maintaining a positive set voltage, so that hot holes generated or remaining in channels may be efficiently removed. Potential levels of the word lines may be prevented from dropping by a leakage current by applying a positive set voltage to global word line groups when the pass circuit unit is deactivated.

Figure 6:
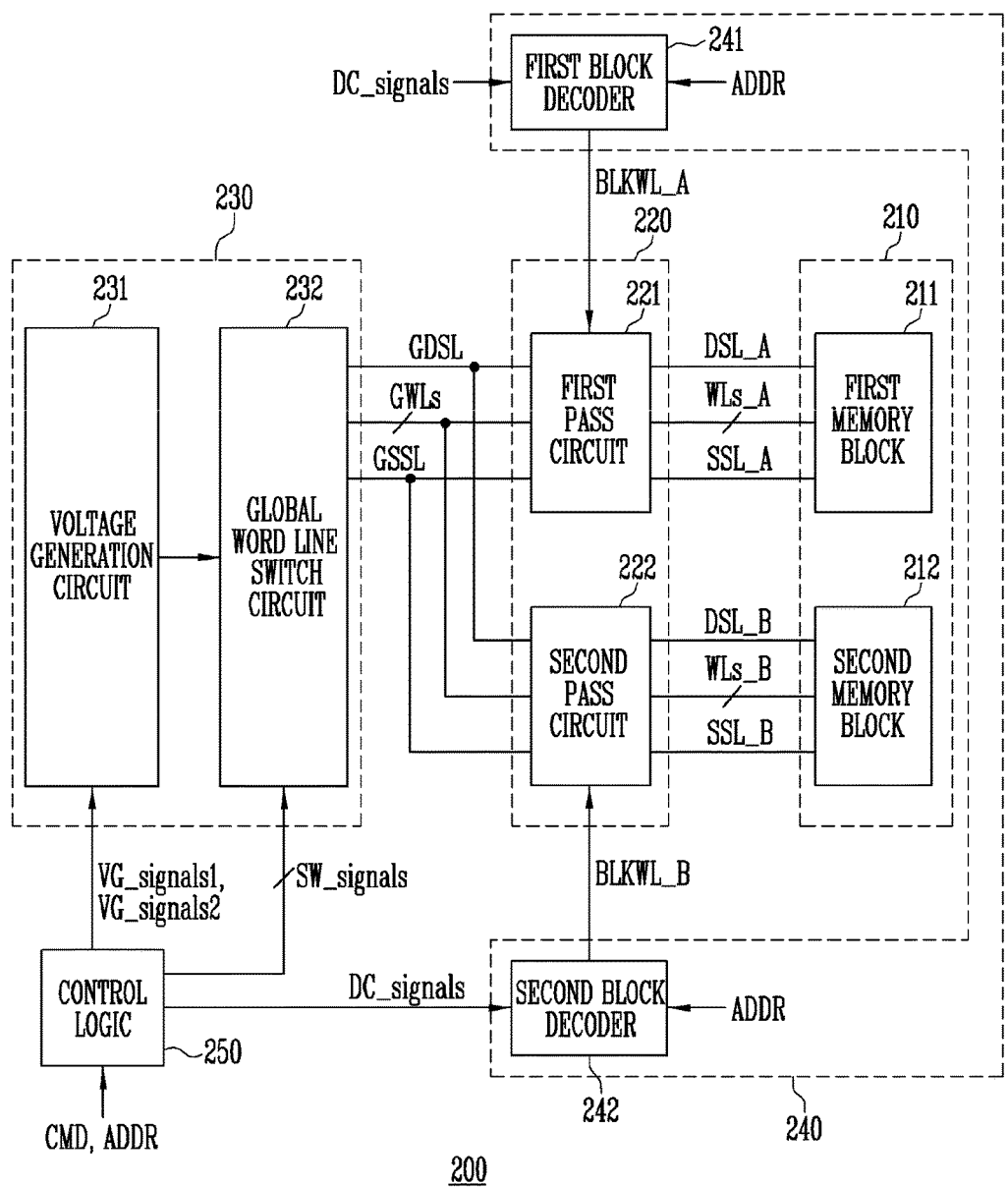
FIG. 6 is a block diagram illustrating a semiconductor memory device according to an embodiment.

FIG. 6 is a block diagram illustrating a semiconductor memory device according to other embodiments.

Referring to FIG. 6, a semiconductor memory device 200 may include a memory 210, a pass circuit unit 220, a voltage supply circuit 230, a block decoder circuit 240, and a control logic 250.

The memory 210 may include a plurality of memory blocks. For convenience of explanation, according to an embodiment, the memory 210 including the first and second memory blocks 211 and 212 is described as an example.

Each of the first and second memory blocks 211 and 212 may include a plurality of memory cells. According to an embodiment, the plurality of memory cells may be non-volatile memory cells. Memory cells coupled to one word line, among the plurality of memory cells, may be defined as one page. In addition, each of the first and second memory blocks 211 and 212 may include a plurality of strings.

The configuration of the first and second memory blocks 211 and 212 may be substantially the same as the first memory block BLK1 illustrated in FIG. 2.

The pass circuit unit 220 may include a plurality of pass circuits. For example, the pass circuit unit 220 may include pass circuits corresponding to the memory blocks included in the memory 210, respectively. For convenience of explanation, according to an embodiment, the memory 210 may include the first and second memory blocks 211 and 212, and the pass circuit unit 220 may include a first pass circuit 221 corresponding to the first memory block 211 and a second pass circuit 222 corresponding to the second memory block 212.

The first pass circuit 221 may be connected between a global drain selection line GDSL, a global word line group GWLs, and a global source selection line GSSL and the drain selection line DSL_A, the word lines WLs_A, and the source selection line SSL_A of the first memory block 211. The first pass circuit 221 may connect or block the global drain selection line GDSL, the global word line group GWLs, and the global source selection line GSSL to or from the drain selection line DSL_A, the word lines WLs_A, and the source selection line SSL_A in response to the first block selection signal BLKWL_A.

The second pass circuit 222 may be coupled between the global drain selection line GDSL, the global word line group GWLs, and the global source selection line GSSL and a drain selection line DSL_B, word lines WLs_B, and a source selection line SSL_B of the second memory block 212. The second pass circuit 222 may connect or block the global drain selection line GDSL, the global word line group GWLs, and the global source selection line GSSL to or from the drain selection line DSL_B, the word lines WLs_B, and the source selection line SSL_B in response to the second block selection signal BLKWL_B.

When a corresponding memory block in operations of the semiconductor memory device 200, for example, program and read operations is a selected memory block, the first pass circuit 221 and the second pass circuit 222 may apply the operating voltages transferred through the global drain selection line GDSL, the global word line group GWLs, and the global source selection line GSSL to a drain selection line, word lines, and a source selection line of the corresponding memory block, and may be deactivated before potential levels of the word lines are discharged upon completion of the operations of the semiconductor device. Thus, word lines having higher potential levels than a ground voltage may be in a floating state by the operating voltages and maintain the higher potential levels than the ground voltage.

When the corresponding memory block in the operations of the semiconductor memory device is an unselected memory block, the first pass circuit 221 and the second pass circuit 222 may connect the global drain selection line GDSL, the global word line group GWLs, and the global source selection line GSSL to a drain selection line, word lines, and a source selection line of the unselected memory block to apply the operating voltages to the unselected memory block for a predetermine time before the operations is completed. The first pass circuit 221 and the second pass circuit 222 may be deactivated before the potential levels of the word lines of the selected memory block are discharged upon completion of the operations of the semiconductor memory device. Therefore, the word lines of the unselected memory block may be floated while maintaining higher potential levels than a ground voltage.

The voltage supply circuit 230 may include a voltage generation circuit 231 and a global word line switch circuit 232.

The voltage generation circuit 231 may generate a plurality of operating voltages for operations of the semiconductor memory device 200 in response to the first and second voltage generation control signals VG_signals1 and VG_signals2.

For example, during a program operation of the semiconductor memory device 200, the voltage generation circuit 231 may generate a program voltage and a pass voltage to be applied to the word lines of the selected memory block in response to the first control signals VG_signals1, and generate a positive set voltage to be applied to the global drain selection line GDSL, the global word line group GWLs, and the global source selection line GSSL after the operations are terminated in response to the second control signals VG_signals2.

The global word line switch circuit 232 may transfer the operating voltages generated by the voltage generation circuit 231 during the operations and the positive set voltage generated after the termination of the operations to the global drain selection line GDSL, the global word line group GWLs, and the global source selection line GSSL. Therefore, although all the pass circuits of the pass circuit unit 220 are deactivated after the operations are terminated, potential levels of the global drain selection line GDSL, the global word line group GWLs, and the global source selection line GSSL may be maintained at a positive voltage, so that potential levels of the word lines of the first and second memory blocks 211 and 212 may be prevented from dropping by a leakage current.

The block decoder circuit 240 may include a plurality of block decoders. For example, the block decoder circuit 240 may include a plurality of block decoders corresponding to the plurality of memory blocks included in the memory 210. For convenience of explanation, according to an embodiment, the memory 210 may include the first and second memory blocks 211 and 212, and the block decoder circuit 240 may include a first block decoder 241 corresponding to the first memory block 211 and a second block decoder 242 corresponding to the second memory block 212.

The block decoder circuit 240 may generate the first block selection signal BLKWL_A and the second block selection signal BLKWL_B in response to the address signal ADDR and the decoder control signal DC_signals.

The first block decoder 241 may generate the first block selection signal BLKWL_A in response to the address signal ADDR and the decoder control signal DC_signals. For example, when the first memory block 211 is a selected memory block during the operations of the semiconductor memory device 200, the first block decoder 241 may generate and output the first block selection signal BLKWL_A activated at a high potential level to the first pass circuit 221 in response to the address signal ADDR corresponding to the first memory block 211.

When the first memory block 211 is an unselected memory block, the first block decoder 241 may output the first block selection signal BLKWL_A which remains deactivated and has a high voltage level for a predetermined time before the operations are terminated to the first pass circuit 221 in response to the address signal ADDR corresponding to the second memory block 212.

The second block decoder 242 may generate the second block selection signal BLKWL_B in response to the address signal ADDR and the decoder control signal DC_signals. For example, when the second memory block 212 is a selected memory block during operations of the semiconductor memory device 200, the second block decoder 242 may generate and output the second block selection signal BLKWL_B activated at a high potential level to the second pass circuit 222 in response to the address signal ADDR corresponding to the second memory block 212.

When the second memory block 212 is an unselected memory block during the operations of the semiconductor memory device, the second block decoder 242 may output the second block selection signal BLKWL_B which remains deactivated and has a high voltage level for a predetermine time right before the operations are terminated to the second pass circuit 222 in response to the address signal ADDR corresponding to the first memory block 211.

The control logic 250 may control the voltage supply circuit 230 and the block decoder circuit 240 in response to the command signal CMD and the address signal ADDR which are externally input. For example, when the command signal CMD relating to a program operation or a read operation is input, the control logic 250 may generate and output the first and second voltage generation control signals VG_signals1 and VG_signals2 so that the voltage generation circuit 231 of the voltage supply circuit 230 may generate a plurality of operating voltages and a positive set voltage, and may generate and output the switching control signals SW_signals to apply the plurality of operating voltages to the global drain selection line GDSL, the global word line group GWLs, and the global source selection line GSSL during the operations of the semiconductor memory device 200 and apply the positive set voltage to the global drain selection line GDSL, the global word line group GWLs, and the global source selection line GSSL right after the operations of the semiconductor memory device 200 are completed.

The control logic 250 may generate the decoder control signal DC_signals to control the block decoder circuit 240 so that a block decoder corresponding to a selected memory block, among the plurality of block decoders included in the block decoder circuit 240, may output a block selection signal activated at a high potential level and a block decoder corresponding to an unselected memory block may output a block selection signal activated at a high potential level for a predetermined time and deactivated to a low level right before the operations of the semiconductor memory device are completed.

Operations of the semiconductor memory device are described below with reference to FIG. 6.

A program operation, among the operations of the semiconductor memory device, is described as an example. However, the disclosure is not limited thereto and is applicable to a read operation and an erase operation.

According to an embodiment, a program operation may be performed on, for example, the first memory block 211 between the memory blocks 211 and 212. In other words, the first memory block 211 may be defined as a selected memory block and the second memory block 212 may be defined as an unselected memory block.

The semiconductor memory device may receive the command signal CMD for a program command and the address signal ADDR corresponding to the first memory block 211 from a host outside the semiconductor memory device.

The control logic 250 may generate and output the first voltage generation control signals VG_signals1 and the second voltage generation control signals VG_signals2 according to the command signal CMD and an algorithm stored therein. The voltage generation circuit 231 may generate and output operating voltages to be applied to the selected first memory block 211 during a program operation in response to the first voltage generation control signals VG_signals1.

The global word line switch circuit 232 may apply the operating voltages generated by the voltage generation circuit 231 to the global drain selection line GDSL, the global word line group GWLs, and the global source selection line GSSL in response to the switching control signals SW_signals output from the control logic 250.

The block decoder circuit 240 may generate and output the first block selection signal BLKWL_A activated at a high voltage level and the second block selection signal BLKWL_B deactivated to a ground voltage level in response to the address signal ADDR and the decoder control signal DC_signals.

The first pass circuit 221 may connect the global drain selection line GDSL, the global word line group GWLs, and the global source selection line GSSL to the drain selection line DSL_A, the word lines WLs_A, and the source selection line SSL_A of the first memory block 211 to apply the operating voltages to the first memory block 211 in response to the first block selection signal BLKWL_A.

The second pass circuit 222 may remain deactivated in response to the second block selection signal BLKWL_B.

Subsequently, after the operations of the semiconductor memory device are completed, the second block decoder 242 may generate and output the second block selection signal BLKWL_B activated at a high voltage level for a predetermined time. The second pass circuit 222 may apply operating voltages to the drain selection line DSL_B, the word lines WLs_B, and the source selection line SSL_B to the second memory block 212 for a predetermined time in response to the second block selection signal BLKWL_B.

Subsequently, right before the operations of the semiconductor memory device are completed, the block decoder 240 may deactivate the first block selection signal BLKWL_A and the second block selection signal BLKWL_B to a ground voltage level and output the deactivated first and second selection signals BLKWL_A and BLKWL_B. As a result, the first and second pass circuits 221 and 222 may be deactivated. The drain selection line, the word lines, and the source selection line of the first memory block 211 and the second memory block 212 may be floated. The drain selection line, the word lines, and the source selection line of the first and second memory blocks 211 and 212 may be floated while maintaining positive potential levels by the operating voltages. The plurality of strings included in the first and second memory blocks 211 and 212 may effectively eliminate hot holes generated or introduced in a channel.

After the operations of the semiconductor memory device are terminated, the global word line switch circuit 232 may apply the positive set voltage generated by the voltage generation circuit 231 to the global drain selection line GDSL, the global word line group GWLs, and the global source selection line GSSL. Thus, the global drain selection line GDSL, the global word line group GWLs, and the global source selection line GSSL may maintain positive set voltage levels. As a result, potential levels of the drain selection line, the word lines, and the source selection line of each of the first and second memory blocks 211 and 212 may be prevented from being reduced by a leakage current.

As described above, according to an embodiment, before operations of a semiconductor memory device are terminated, word lines of a selected memory block and unselected memory blocks may be floated while maintaining a positive set voltage, so that hot holes generated or remaining in channels may be effectively eliminated. By applying a positive set voltage to global word lines when a pass circuit unit is deactivated, potential levels of the word lines may be prevented from dropping by a leakage current.

Figure 7:
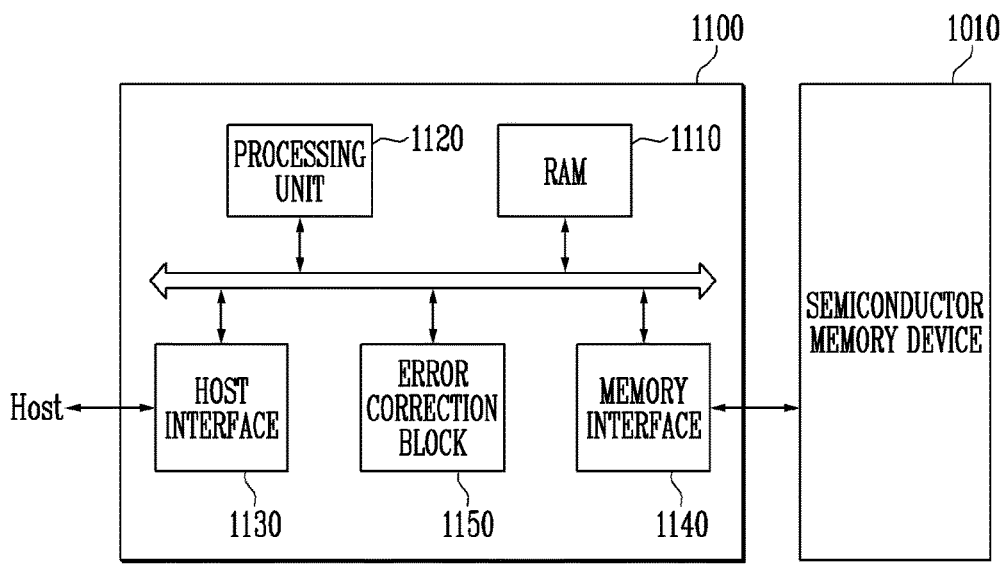
FIG. 7 is a block diagram illustrating a memory system including a semiconductor memory device illustrated in FIG. 1 or FIG. 6.

FIG. 7 is a block diagram illustrating a memory system 1000 including the semiconductor memory devices illustrated in FIG. 1 or 6 and discussed with regards to the figures.

Referring to FIG. 7, the memory system 1000 may include a semiconductor memory device 1010 and a controller 1100.

The semiconductor memory device 1010 may be configured and operated in substantially the same manner as described above with reference to FIG. 1 or 6. Thus, a description thereof will be omitted.

The controller 1100 may be coupled to a host and the semiconductor memory device 1010. The controller 1100 may access the semiconductor memory device 1010 at the request of the host. For example, the controller 1100 may control a read operation, a program operation, an erase operation, and/or a background operation of the semiconductor memory device 1010. The controller 1100 may provide an interface between the semiconductor memory device 1010 and the host. The controller 1100 may drive firmware for controlling the semiconductor memory device 1010.

The controller 1100 may include a random access memory (RAM) 1110, a processing unit 1120, a host interface 1130, a memory interface 1140 and an error correction block 1150. The RAM 1210 may be used as an operation memory of the processing unit 1120, a cache memory between the semiconductor memory device 1010 and the host, and/or a buffer memory between the semiconductor memory device 1010 and the host. The processing unit 1120 may control operations of the controller 1100. In addition, the controller 1100 may temporarily store program data provided from the host during a write operation.

The host interface 1130 may include a protocol for data exchange between the host and the controller 1100. According to an embodiment, the controller 1100 may communicate with the host using at least one of a variety of interface protocols, such as a universal serial bus (USB) protocol, a multimedia card (MMC) protocol, a peripheral component interconnection (PCI) protocol, a PCI-Express (PCI-E) protocol, an advanced technology attachment (ATA) protocol, a Serial-ATA protocol, a Parallel-ATA protocol, a small computer small interface (SCSI) protocol, an enhanced small disk interface (ESDI) protocol, an integrated drive electronics (IDE) protocol, and a private protocol.

The memory interface 1140 may interface with the semiconductor memory device 1010. For example, the memory interface may include a NAND interface or a NOR interface.

The error correction block 1150 may detect and correct errors in data received from the semiconductor memory device 1010 by using an error correction code (ECC). The processing unit 1120 may control the semiconductor memory device 1010 to control a read voltage according to an error detection result and perform a re-read. According to an embodiment, the error correction block 1150 may be provided as a component of the controller 1100.

The controller 1100 and the semiconductor memory device 1010 may be integrated in one semiconductor device. According to an embodiment, the controller 1100 and the semiconductor memory device 1010 may be integrated in a single semiconductor device to form a memory card such as a PC card (personal computer memory card international association (PCMCIA)), a compact flash card (CF), a smart media card (SMC), a memory stick, a multimedia card (MMC, RS-MMC or MMCmicro), an SD card (SD, miniSD, micro SD or SDHC), a universal flash storage device (UFS), etc.

The controller 1100 and the semiconductor memory device 1010 may be integrated in a single semiconductor device to form a solid state drive (SSD). The SSD may include a storage device for storing data in a semiconductor memory device. When the memory system 1000 is used as an SSD, operational rates of the host coupled to the memory system 1000 may be significantly improved.

In another example, the memory system 1000 may be used as one of several elements in various electronic devices such as a computer, an ultra mobile PC (UMPC), a workstation, a net-book, a personal digital assistant (PDA), a portable computer, a web table, a wireless phone, a mobile phone, a smart phone, an e-book, a portable multimedia player (PMP), a portable game machine, a navigation device, a black box, a digital camera, a three-dimensional television, a digital audio recorder, a digital audio player, a digital picture recorder, a digital picture player, a digital video recorder, a digital video player, a device for transmitting/receiving information in wireless environments, devices for home networks, devices for computer networks, devices for telematics networks, an RFID device, other devices for computing systems, etc.

According to an example of an embodiment, the semiconductor memory device 1010 or the memory system 1000 may be packaged in various forms. For example, the semiconductor memory device 1010 or the memory system 1000 may be packaged by various methods such as a package on package (PoP), a ball grid array (BGA), a chip scale package (CSP), a plastic leaded chip carrier (PLCC), a plastic dual in line package (PDIP), a die in waffle pack, a die in wafer form, a chip on board (COB), a ceramic dual in line package (CERDIP), a plastic metric quad flat package (MQFP), a thin quad flat package (TQFP), a small outline integrated circuit (SOIC), a shrink small outline package (SSOP), a thin small outline package (TSOP), a system in package (SIP), a multi chip package (MCP), a wafer-level fabricated package (WFP), a wafer-level processed stack package (WSP), etc.

Figure 8:
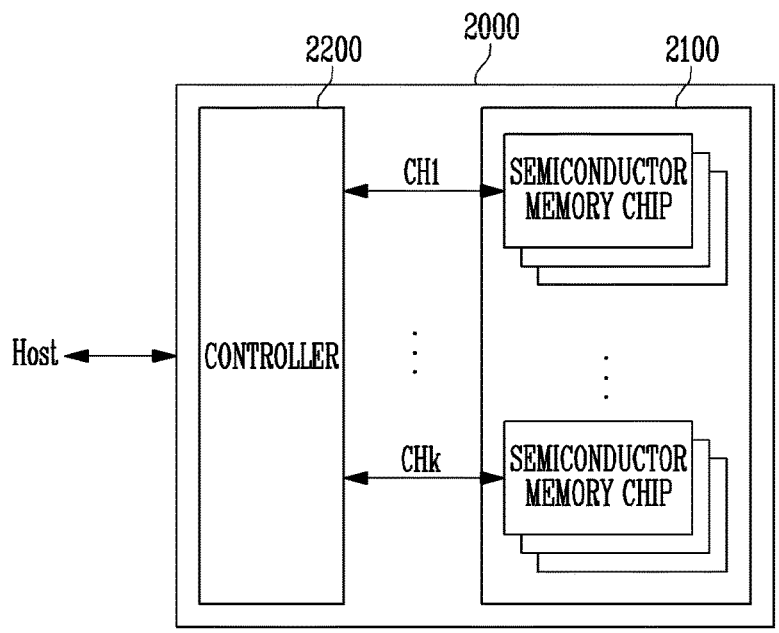
FIG. 8 is a block diagram illustrating an application example of a memory system illustrated in FIG. 7.

FIG. 8 is a block diagram illustrating an application example (2000) of the memory system 1000 illustrated in FIG. 7.

Referring to FIG. 8, a memory system 2000 may include a semiconductor memory device 2100 and a controller 2200. The semiconductor memory device 2100 may include semiconductor memory chips. The semiconductor memory chips may be divided into a plurality of groups.

FIG. 8 illustrates the plurality of groups communicating with the controller 2200 through first to k-th channels CH1 to CHk. Each of the semiconductor memory chips may be configured and operated in substantially the same manner as the semiconductor memory devices 100 and 200 described above with reference to FIG. 1 or 6.

Each group may communicate with the controller 2200 through a single common channel. The controller 2200 may be configured in substantially the same manner as the controller 1100 described with reference to FIG. 7, and configured to control the plurality of memory chips of the semiconductor memory device 2100 through the plurality of channels CH1 to CHk.

Figure 9:
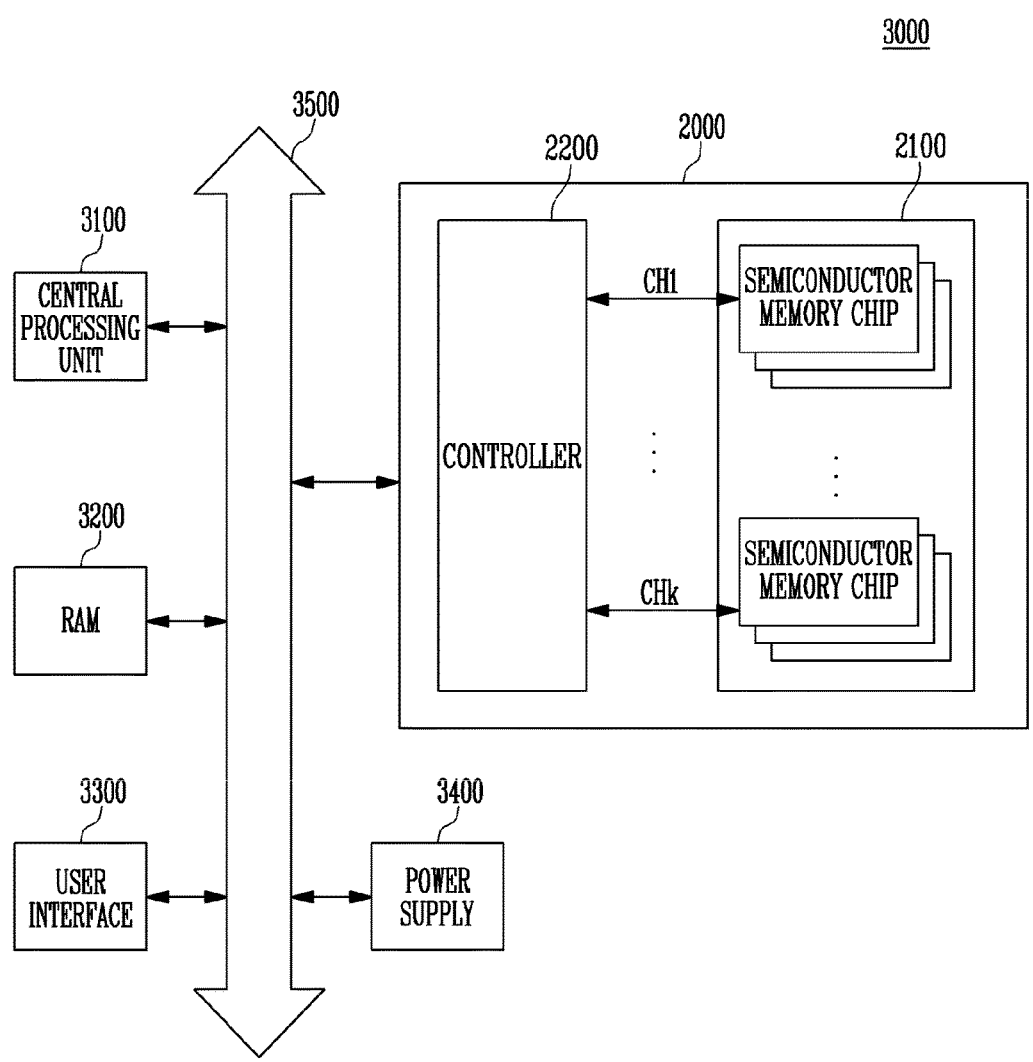
FIG. 9 is a block diagram illustrating a computing system including a memory system described with reference to FIG. 8.

FIG. 9 is a block diagram illustrating a computing system 3000 having the memory system 2000 described above with reference to FIG. 8.

Referring to FIG. 9, the computing system 3000 may include a central processing unit 3100, a random access memory (RAM) 3200, a user interface 3300, a power supply 3400, a system bus 3500, and the memory system 2000.

The memory system 2000 may be electrically connected to the central processing unit 3100, the RAM 3200, the user interface 3300 and the power supply 3400 through the system bus 3500. Data provided trough the user interface 3300 or processed by the central processing unit 3100 may be stored in the memory system 2000.

Referring to FIG. 9, the semiconductor memory device 2100 may be coupled to the system bus 3500 through the controller 2200. However, the semiconductor memory device 2100 may be directly coupled to the system bus 3500. The central processing unit 3100 and the RAM 3200 may perform functions of the controller 2200.

As illustrated in FIG. 9, the memory system 2000 illustrated in FIG. 8 may be provided as the memory system 3000. However, the memory system 2000 may be replaced with the memory system 1000 illustrated in FIG. 7. According to an embodiment, the computing system 3000 may include both of the memory systems 1000 and 2000 described above with reference to FIGS. 7 and 8.

According to the present disclosure, generation or introduction of hot holes in a channel of a memory block during operations of a semiconductor memory device may be prevented, so that a stabilized read operation of the memory block may be performed.

It will be apparent to those skilled in the art that various modifications can be made to the above-described examples of embodiments of the present disclosure without departing from the spirit or scope of the application. Thus, it is intended that the present disclosure cover all such modifications provided they come within the scope of the appended claims and their equivalents.

What is claimed is:
1. A semiconductor memory device comprising:
a memory unit including a plurality of memory blocks;
a block decoder circuit configured to generate a plurality of block selection signals based on a decoder control signal and an address signal;
a pass circuit unit configured for connecting first and second global word line groups to word lines of the plurality of memory blocks in response to the plurality of block selection signals;
a voltage supply circuit configured for generating and outputting operating voltages and a positive set voltage to the first and second global word line groups during operations of the semiconductor memory device; and
a control logic configured to control the voltage supply circuit and the block decoder circuit to apply the operating voltages to word lines of a selected memory block, among the plurality of memory blocks, and the positive set voltage to word lines of an unselected memory block, among the plurality of memory blocks, during the operations, wherein the pass circuit unit allows the word lines of the selected memory block and the word lines of the unselected memory block to be floated before potential levels of the word lines of the selected memory block and the word lines of the unselected memory block are discharged upon completion of the operations.

2. The semiconductor memory device of claim 1, wherein the block decoder circuit includes a plurality of block decoders and each of the plurality of block decoders corresponds to at least two of the plurality of memory blocks.

3. The semiconductor memory device of claim 2, wherein the plurality of block decoders are activated to output first and second block selection signals each having a high voltage level for a predetermined time before the operations are completed, and deactivated to output the first and second block selection signals having a ground voltage level.

4. The semiconductor memory device of claim 3, wherein the pass circuit unit applies the operating voltages and the positive set voltage to the word lines of the unselected memory block to increase potential levels of the word lines of the unselected memory block to be greater than the ground voltage level.

5. The semiconductor memory device of claim 1, wherein the voltage supply circuit comprises:
a voltage generation circuit configured for generating the operating voltages and the positive set voltage during the operations; and
a global word line switch circuit configured for transferring the operating voltages and the positive set voltage to the first and second global word line groups, respectively.

6. The semiconductor memory device of claim 5, wherein the plurality of memory blocks correspond to the first global word line group or the second global word line group.

7. The semiconductor memory device of claim 6, wherein the global word line switch circuit applies the operating voltages to the first global word line group and the positive set voltage to the second global word line group when the selected memory block, among the plurality of memory blocks, corresponds to the first global word line group.

8. The semiconductor memory device of claim 1, wherein the voltage supply circuit generates and outputs the positive set voltage to the first and second global word line groups after the operations are completed.

9. The semiconductor memory device of claim 1, wherein the control logic comprises:
a read-only memory (ROM) configured for storing an algorithm for the operations and generating first to third internal control signals and the decoder control signal in response to a command signal for the operations;
a voltage generation control circuit configured for generating first and second voltage generation control signals so that the voltage supply circuit generates the operating voltages and the positive set voltage based on the first and second internal control signals; and
a switching signal generation circuit configured for generating and outputting switching control signals so that the operating voltages and the positive set voltage are transferred to the first global word line group and the second global word line group based on the address signal and the third internal control signal.

10. A semiconductor memory device comprising:
a memory unit including a plurality of memory blocks;
a block decoder circuit configured to generate a plurality of block selection signals based on a decoder control signal and an address signal;
a pass circuit unit configured to connect global word lines to word lines of a selected memory block, among the plurality of memory blocks, based on the plurality of block selection signals;
a voltage supply circuit configured for generating and outputting operating voltages to the global word lines during operations; and
a control logic configured to control the block decoder circuit so that the pass circuit unit applies the operating voltages to word lines of an unselected memory block, among the plurality of memory blocks, for a predetermined time before the operations are completed,
wherein the voltage supply circuit applies a positive set voltage to the global word lines after the operations are completed.

11. The semiconductor memory device of claim 10, wherein the pass circuit unit is deactivated after the predetermine time to float voltage levels of word lines of the plurality of memory blocks.

12. The semiconductor memory device of claim 10, wherein the block decoder circuit includes a plurality of block decoders and each of the block decoders corresponds to each of the plurality of memory blocks.

13. The semiconductor memory device of claim 12, wherein the plurality of block decoders are activated to output the plurality of block selection signals having a high voltage level for the predetermined time before the operations are completed, and deactivated to output the plurality of block selection signals having a ground voltage level.

14. The semiconductor memory device of claim 10, wherein the voltage supply circuit comprises:
a voltage generation circuit configured for generating the operating voltages during the operations and the positive set voltage after the operations are completed; and
a global word line switch circuit configured for applying the operating voltages to the global word lines during the operations and the positive set voltage to the global word lines after the operations are completed.

15. A method of operating a semiconductor memory device, the method comprising:
generating operating voltages for operations and applying the operating voltages to global word lines;
connecting word lines of a selected memory block, among a plurality of memory blocks, to the global word lines, and applying the operating voltages to the word lines of the selected memory block;
floating voltage levels of the word lines of the selected memory block by blocking the word lines of the selected memory block from the global word lines before the operations are completed; and
applying a positive set voltage to the global word lines after the operations are completed.

16. The method of claim 15, wherein in the floating of the voltage levels of the word lines, the voltage levels of the word lines are floated while maintaining positive potential levels by the operating voltages.

17. The method of claim 15, wherein the positive set voltage is applied to word lines of an unselected memory block, among the plurality of memory blocks, when the operating voltages are applied to the word lines of the selected memory block.

18. The method of claim 17, wherein voltage levels of the word lines of the unselected memory block are floated when the voltage levels of the word lines of the selected memory block are floated.

19. A pass circuit unit comprising:
a pass circuit configured to transfer or block operating voltages through a global word line group to or from word lines during an operation based on activation or deactivation of the pass circuit,
wherein the pass circuit is deactivated before potential levels of the word lines are discharged upon completion of the operation to allow voltage levels of word lines having a higher potential level than a ground voltage by way of the operating voltages to be floated,
wherein a positive set voltage is applied to the global word line group when the word lines are floated.

* * * * *